United States Patent [19]

Chiba et al.

[11] 4,406,964
[45] Sep. 27, 1983

[54] ACOUSTIC SURFACE WAVE TRANSDUCER WITH IMPROVED INBAND FREQUENCY CHARACTERISTICS

[75] Inventors: Takao Chiba; Nobuyoshi Sakamoto; Kenji Kohro, all of Tokyo, Japan

[73] Assignees: Oki Electric Industry Co., Ltd.; Nippon Hoso Kyokai, both of Tokyo, Japan

[21] Appl. No.: 283,630

[22] Filed: Jul. 15, 1981

[30] Foreign Application Priority Data

Jul. 23, 1980 [JP] Japan .................. 55-99763

[51] Int. Cl.$^3$ .............................................. H03H 9/64
[52] U.S. Cl. .................. 310/313 B; 333/151; 333/194
[58] Field of Search ........... 310/313 R, 313 B, 313 C, 310/313 D; 333/151, 154, 194, 195, 152, 153, 193, 196

[56] References Cited

U.S. PATENT DOCUMENTS 4,340,834  7/1982  Sato ........................ 310/313 D
4,346,322  8/1982  Sato et al. .................. 313/313 B

FOREIGN PATENT DOCUMENTS 55-66118  5/1980  Japan ..................... 310/313 C Primary Examiner—J. D. Miller
Assistant Examiner—D. L. Rebsch
Attorney, Agent, or Firm—Armstrong, Nikaido, Marmelstein & Kubovcik

[57] ABSTRACT

An acoustic surface wave transducer with a transmission interdigital electrode (2A) and a reception interdigital electrode (2B in FIG. 10A-D) on a piezoelectric surface (1) has been improved by reducing inband dispersion of frequency characteristics by providing an edge effect canceler ($k_1$), which cancels an undesired surface wave (E-a, E-b) generated at the external edge of the extreme end finger of the interdigital electrodes. Said edge effect canceler is constructed so that the length of the extreme end finger (11a) of the interdigital electrode (10, 20 in FIG.5A) is half of the length of the second extreme end finger (12a) of said interdigital electrode, and the spacing between said extreme end finger and the second extreme end finger is ¼ wavelength of the acoustic surface Wave. Thus, the phase of the undesired surface wave generated by the extreme end finger of the transmission interdigital electrode is opposite to that generated by the second extreme end finger at the reception side, and the strength of the former is the same as that of the latter. Thus, those surface waves are cancelled by each other at the reception side, and the inband deviation or dispersion in amplitude characteristics and/or group delay characteristics of the transducer is improved.

10 Claims, 19 Drawing Figures

ACOUSTIC SURFACE WAVE TRANSDUCER WITH IMPROVED INBAND FREQUENCY CHARACTERISTICS

BACKGROUND OF THE INVENTION

The present invention relates to an acoustic surface wave transducer, and in particular, relates to such a device with improved inband frequency characteristics. The present acoustic surface wave transducer is applicable to mechanical bandpass filter, a delay line, convolver, and/or a resonator, in HF, VHF, and/or UHF bands.

Figure 1:
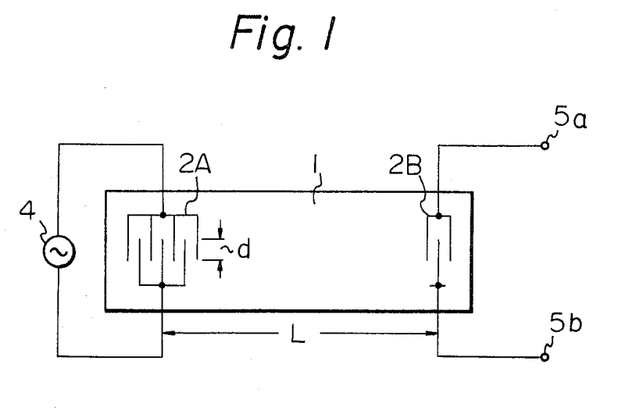
FIG. 1 shows the basic structure of a prior art acoustic surface wave transducer type bandpass filter.

FIG. 1 shows a basic structure of a prior acoustic surface wave device, in which the reference numeral 1 is a piezoelectric substrate made of, for instance, Lithium Niobate (LiNbO$_3$), LiTaO$_3$, or PZT, 2A and 2B are interdigital electrodes positioned on the surface of the substrate 1, 4 is a high frequency power source coupled with the first interdigital electrode 2A, and 5a and 5b are output terminals coupled with the second interdigital electrode 2B. The interdigital electrodes 2A and 2B are positioned with a predetermined spacing L, and each interdigital electrode is so arranged that each of the fingers overlap with one another by the length (d). Upon application of a high frequency signal to the first transmission interdigital electrode 2A, the mechanical vibration is induced in substrate 1, and that vibration propagates in the substrate 1 in the perpendicular direction to the fingers in the form of an acoustic surface wave. The second reception interdigital electrode 2B located along the path of that acoustic surface wave transduces the mechanical energy in the substrate 1 to electrical energy, and then between an input signal and an output signal, a signal processing is performed, like a delay line, a bandpass filter, an oscillator, a mixer, and/or a convolver. The width of each finger of an interdigital electrode, and the spacing between two fingers may be ¼ wavelenth, or ⅛ wavelength. As an alternative, a finger of ⅛ wavelength width and a finger of ⅜ wavelength width are arranged alternately. The arrangement of ⅛ wavelength width of fingers with the spacing of ⅛ wavelength is called a split type interdigital electrode.

Many improvements of such an acoustic surface wave device have been proposed. U.S. Pat. Nos. 3,810,257 and 3,886,504 are a few of these. The former discloses a transducer which reduces triple transit signals, and the latter discloses the improvement of the resonator devices.

Figure 2:
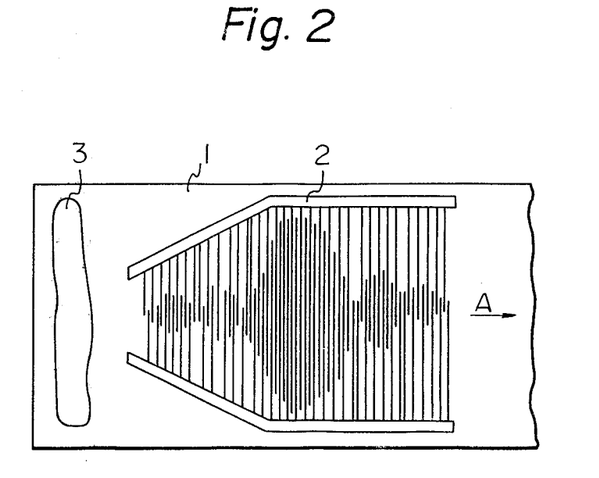
FIG. 2 shows another prior art acoustic surface wave type bandpass filter.
Figure 3A:
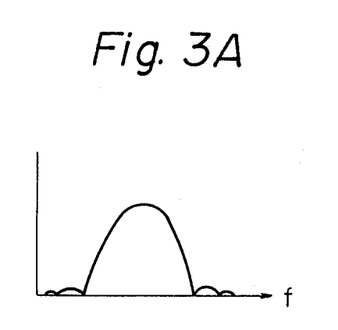
FIGS. 3A, 3B and 3C show three typical characteristics of a bandpass filter.
Figure 3B:
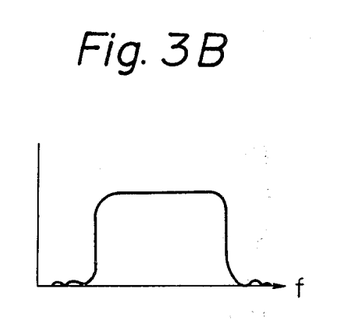

FIG. 2 shows another prior transducer, in which the overlap length (d) between the two adjacent fingers is not constant, but depends upon each of the fingers. The symbol A shows the propagation of an acoustic surface wave. An interdigital electrode having the non-uniform overlap length (d) is called an apodized electrode, while an interdigital electrode having the equal overlap length is called a regular electrode. A bandpass filter with a regular interdigital electrode provides single hump frequency characteristics as shown in FIG. 3A, where the horizontal axis shows the frequency and the vertical axis shows the response level. On the other hand, a bandpass filter with an apodized interdigital electrode provides the flat frequency characteristics as shown in FIG. 3B.

In the embodiment of FIG. 2, the overlap length between electrode fingers is long at the middle portion of the electrode, and is short at both the end portions of the electrode, that is to say, a strong acoustic wave is generated at the middle portion of the electrode, and a rather weak acoustic wave is generated at the end portions of the electrode. An apodized electrode is preferable for a bandpass filter which has the improved flat frequency characteristics as shown in FIG. 3B. Those flat characteristics are important for a bandpass filter in a television transmission system, which requires the flat characteristics with less than 0.2 dB in the inband frequency characteristics.

The prior transducer of FIG. 2 has at least two mode for improving the characteristics of the filter. One is the presence of an acoustical absorbent 3 made of plastic near the end of the substrate 1 for preventing the effect of the reflection of the wave at the end of the substrate. The second improvement is providing a rough or uneven surface on the bottom of the substrate 1 for scattering the acoustic wave internally of the substrate, to eliminate the effect of internally directed waves.

Figure 3C:
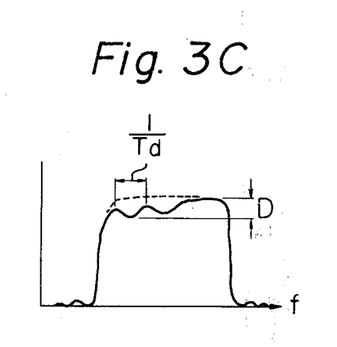

However, the prior acoustic wave transducers described above have the disadvantage that the amplitude characteristics and the group delay characteristics have a rather large inband deviation D as shown in FIG. 3C. When a bandpass filter is used in a television transmission apparatus, that inband deviation must be less than 0.2 dB in the amplitude characteristics, and less than 20 nS in the group delay characteristics. However, a prior art bandpass filter can provide only 0.6 dB of inband deviation for the amplitude characteristics, and 60 nS for the group delay characteristics. Therefore, when the inband deviation characteristics must be extremely small, a prior acoustic wave filter cannot be utilized; instead, an LC filter has been utilized for that purpose. However, an LC filter has the disadvantages that its size is large, precise adjustment of an inductance and/or capacitance is necessary, and the phase characteristics are deteriorated in the border of the pass band and the attenuation bands.

SUMMARY OF THE INVENTION

It is an object of the present invention to overcome the disadvantages and limitations of prior acoustic surface wave transducers by providing a new and improved acoustic surface wave transducer.

It is also an object of the present invention to provide a bandpass filter utilizing an acoustic surface wave transducer with less inband deviation in both the amplitude characteristics and the group delay characteristics.

The above and other objects are attained by an acoustic surface wave transducer comprising (a) substrate means having at least a piezoelectric surface, (b) a first interdigital electrode having a pair of comb-line type half electrodes engaged interdigitally with each other, disposed on said piezoelectric surface, and being operable to convert an input electrical signal from a power source to acoustic surface waves which propagate on said piezoelectric surface, (c) a second interdigital electrode having a pair of come-line type half electrodes engaged interdigitally with each other, disposed on said piezoelectric surface and spaced from said first interdigital electrode by a predetermined distance, to convert said acoustic surface waves in said piezoelectric surface to an output electrical signal, and (d) an edge effect canceler provided at least at one of the extreme edges of at least one of said interdigital electrodes, said edge effect canceler being constructed so that the length of the extreme end finger of said half electrode is approximately half of the length of the second extreme end finger of said half electrode, and the spacing between said extreme end finger and the second extreme end finger is ½ wavelength of the acoustic surface wave.

Said edge effect canceler may be located either on a transmission interdigital electrode, or on a reception interdigital electrode, and said edge effect canceler may be located at both ends of each interdigital electrode.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 4A:
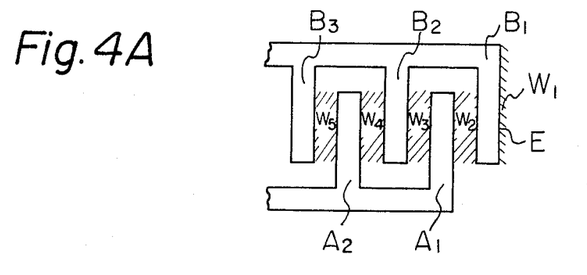
FIGS. 4A, 4B and 4C show the edge effect of an acoustic surface wave transducer for the explanation of the principle of the present invention.

We have studied a prior bandpass filter using an acoustic surface wave transducer, and the inband deviation of the characteristics of the amplitude characteristics and the group delay characteristics. And we found that the edge effect of an interdigital electrode deteriorates the inband characteristics of a bandpass filter. The edge effect of an interdigital electrode is described first in accordance with FIGS. 4A, 4B and 4C.

Conventionally, it has been supposed that an acoustic surface wave is generated between each two adjacent fingers of a pair of engaged interdigital electrodes. Therefore, in FIG. 4A, when a first group of fingers $B_1$, $B_2$, and $B_3$, and a second group of fingers $A_1$, and $A_2$ are engaged, the acoustic surface wave has been supposed to be generated in the area $W_2$ between $A_1$ and $B_1$, $W_3$ between $A_1$ and $B_2$, $W_4$ between $A_2$ and $B_2$, and $W_5$ between $A_2$ and $B_3$. However, we have found that an acoustic surface wave is also generated at the external edge E of the extreme end finger $B_1$, or the area $W_1$ contacting the edge E, although there is no finger which faces with the edge E. The open-faced edge E will thus be designated an "unobstructed" edge. The generation of an acoustic surface wave at the external edge E of the extreme end finger, or the edge effect, is proved as follows.

Figure 4B:
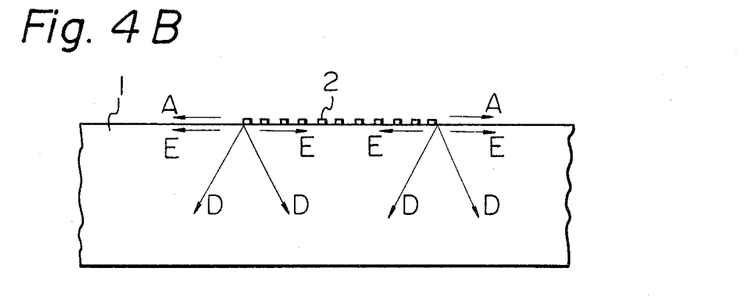

We observed an acoustic surface wave by using a laser holographic technique at the side wall of the substrate as shown in FIG. 4B, and found that there are generated not only a desired surface wave A, but also undesired surface waves E, and bulk waves D which are generated at the external edge of the extreme end fingers. The undesired waves are not only the surface wave E, but also the bulk wave D which is directed into the substrate. The effect of the latter bulk wave D can be cancelled by a conventional uneven or rough bottom surface of the substrate. However, the undesired surface wave E deteriorates the characteristics of a filter. The wavelength of that undesired surface wave E is almost the same as the wavelength of the desired acoustic surface wave which is generated between two confronting fingers. That undesired surface wave E may be a Rayleigh wave, or a pseudo acoustic surface wave, although the physical mechanism for the generation of that undesired wave is unknown.

Figure 4C:
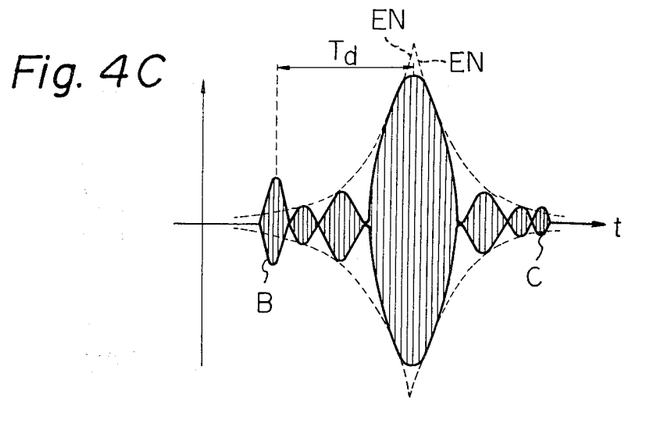

The presence of that undesired surface wave E generated at the outer edge of the extreme end fingers is also proved by an impulse response of an interdigital electrode as described in accordance with FIG. 4C. FIG. 4C shows an example of an impulse response of an interdigital electrode. As is well known, the characteristics or the transfer function F of a filter is given in terms of impulse response function as follows:

$$F = H_1(\omega) \cdot H_2(\omega) \exp(j\omega L/v)$$

where F is a transfer function of a filter, $H_1(\omega)$ is a Fourier transform of an impulse response of a first interdigital electrode or a transmission interdigital electrode, $H_2(\omega)$ is a Fourier transform of an impulse response of a second or a reception interdigital electrode, $(\omega)$ is angular frequency, L is the length between the transmission and the reception electrodes, and v is the sound velocity of the surface wave in the substrate. When an interdigital electrode is a regular interdigital electrode which has the same facing lengths for all the fingers, the envelope EN of an impulse response is triangular. When an interdigital electrode is an apodized electrode, that envelope is somewhat curved. In FIG. 4C, the presence of the spurious responses B and C, which are not within the envelope EN, should be noted. The length $T_d$ between the centers of the response and the spurious response B implies the presence of the edge effect, and the deterioration of the inband characteristics of a filter, since the period of the ripple of the inband characteristics is exactly the same as $1/T_d$.

Therefore, the basic concept of the present invention is to eliminate that edge effect of an undesired acoustic surface wave, which is generated at the outer edge of the extreme end fingers, by providing an edge effect canceler.

Figure 5A:
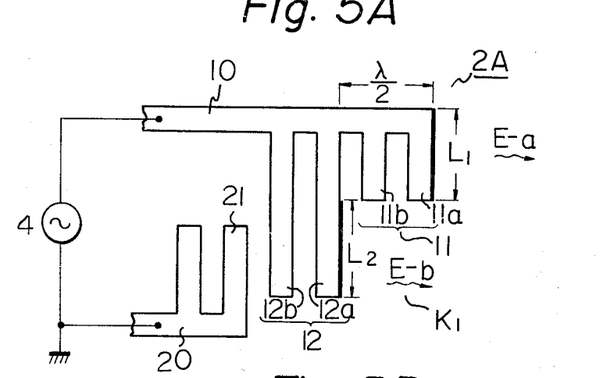
FIG. 5A shows the basic structure of the interdigital electrode according to the present invention.
Figure 5B:
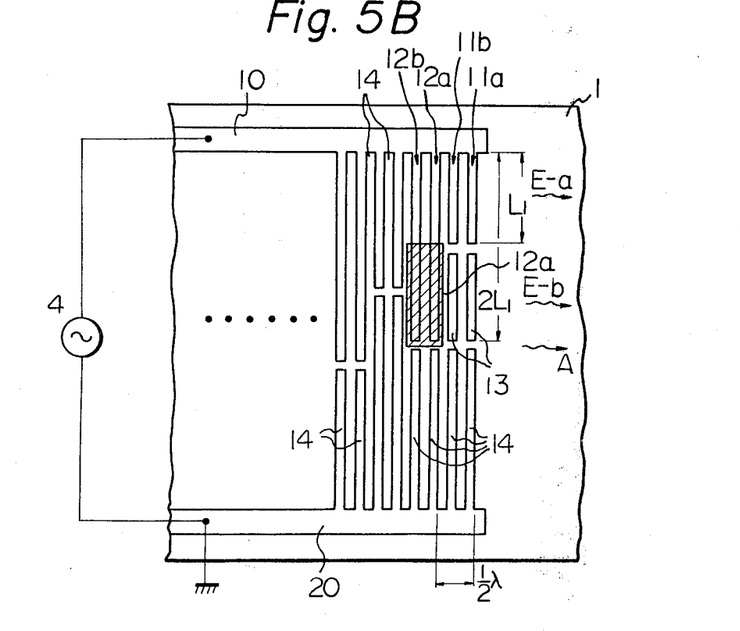
FIG. 5B shows the practical structure of the interdigital electrode using the principle of FIG. 5A.

FIGS. 5A and 5B show a first embodiment of the present transducer, in which the first comb-line type half electrode 10 has a plurality of fingers (11a, 11b, 12a, 12b) which are connected to a power source 4, which provides an alternating signal between the first and the second comb-line type half electrodes 10 and 20. Those half electrodes are interdigitally engaged, as shown in the more detailed drawing of FIG. 5B, to form an interdigital electrode. Since the second half electrode 20 is grounded, that second half electrode 20 does not provide an edge effect, that is, the extreme edge of the second half electrode 20 does not generate an undesired acoustic surface wave. Therefore, it is enough to prevent the edge effect in the first half electrode 10.

In FIG. 5A, the first half electrode 10 has two fingers 11 and 12 which are located outside of the extreme end finger 21 of the second half electrode. And, the length $L_1$ of the extreme end finger 11, and the length $L_1+L_2$ of the second extreme end finger 12 are designed so that $L_1=L_2$. In other words, the length of the second extreme end finger 12 is twice as long as that of the extreme end finger 11, and the unobstructed, acoustically effective lengths $L_1$ and $L_2$ are equal.

Further, the spacing between the extreme edge of the finger 11 and the extreme edge of the finger 12 is designed to be ½ wavelength.

In that configuration, when the interdigital half electrodes 10 and 20 are excited by the power source 4, the edge of the finger 11 generates the undesired surface wave E-a along the length $L_1$, and the edge of the finger 12 generates the undesired surface wave E-b along the length $L_2$. Those undesired surface waves E-a and E-b propagate on the surface of the substrate, and are received by a reception interdigital electrode (not shown).

It should be noted in the above description that the undesired surface wave E-a has the same strength as that of the undesired surface wave E-b, since the length $L_1$ which generates that undesired surface wave is the same as the length $L_2$, and that the phase of the first undesired surface wave E-a is opposite to the second undesired surface wave E-b, since the edges of the fingers 11 and 12 are located with the spacing of ½ wavelength. Accordingly, those two undesired surface waves E-a and E-b are cancelled by each other, and those signals are not received by the reception interdigital electrode. Thus, the edge effect is cancelled, and the inband deviation of a filter is improved. Therefore, the structure of FIG. 5A is called an edge effect canceler $K_1$, or an undesired-wave canceler.

In FIG. 5A, each of the fingers 11 and 12 are split fingers, and have a pair of sub-fingers 11a and 11b, and 12a and 12b, respectively. A split finger has the advantage that it can cancel the reflection of the surface wave due to the difference of the acoustic impedance between a substrate with an electrode conductor, and a substrate with no electrode conductor. In case of a split electrode, it should be appreciated that the width of each sub-finger, and the spacing between each of the sub-fingers are ⅛ wavelength. Of course, the present invention is applicable not only to a split electrode, but also an ordinary electrode. In case of an ordinary electrode, the width and the spacing between each of the fingers is ¼ wavelength.

FIG. 5B shows a more detailed structure of the actual transducer, and the concept of FIG. 5B is the same as that of FIG. 5A. The length $L_1$ of the extreme end finger 11 is half of the length of the second extreme end finger 12. And, the spacing between fingers 11 and 12 is ½ wavelength. Therefore, the undesired surface wave E-b generated at the right-hand portion 12a of the finger 12 is cancelled by the undesired surface wave E-a generated by the finger 11.

The embodiment of FIG. 5B has dummy fingers 14 which confront with the corresponding facing fingers of the opposite electrode, and a floating finger 13 located between the extreme end finger 11 and the dummy finger 14 at the extreme end portion. The dummy finger and the floating finger do not generate an acoustic surface wave, but are provided just for the smooth transmission of the surface wave in the substrate by reducing the difference of the sound velocity between the substrate covered with an electrode conductor and the substrate with no electrode conductor. The presence of a dummy finger and a floating finger improves the characteristics of a transducer further.

The acoustic surface wave transducer of FIGS. 5A and 5B may have an area 3 covered with a plastic acoustical absorbent as shown in FIG. 2, and the bottom of the substrate may be rough or uneven to scatter a bulk wave as described in accordance with FIG. 4B.

Figure 6:
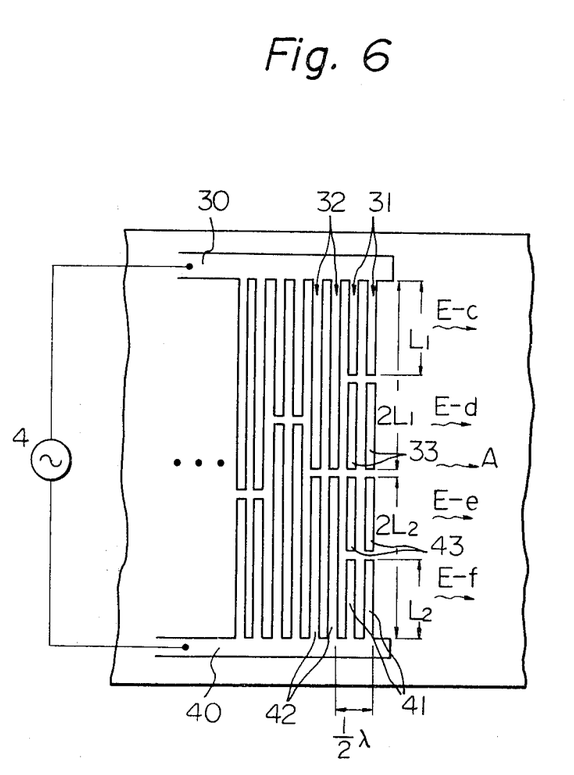
FIG. 6 shows another structure of the interdigital electrode according to the present invention.

FIG. 6 shows another transducer according to the present invention, in which a pair of interdigital half electrodes 30 and 40 are excited by a balanced power source 4. That is to say, no half electrode is grounded. In the embodiment of FIG. 6, both the electrodes 30 and 40 have the structure for preventing the edge effect. The length $L_1$ of the extreme end finger 31 of the electrode 30 is half of $2L_1$ of the second extreme end finger 32, and the length $L_2$ of the extreme end finger 41 of the second electrode 40 is half of $2L_2$ of the second extreme end finger 42. Of course, the spacing between the fingers 31 and 32, and the fingers 41 and 42 is ½ wavelength. In the above configuration, the undesired surface wave E-c generated by the edge of the finger 31 is cancelled by the undesired surface wave E-d generated by the edge of the finger 32 at the side facing the reception electrode. Similarly, the undesired surface wave E-e generated by the top half portion of the finger 42 is cancelled by the undesired surface wave E-f generated by the edge of the finger 41 at the side facing the reception electrode. In FIG. 6, the fingers 33 and 43 are floating fingers.

Figure 7:
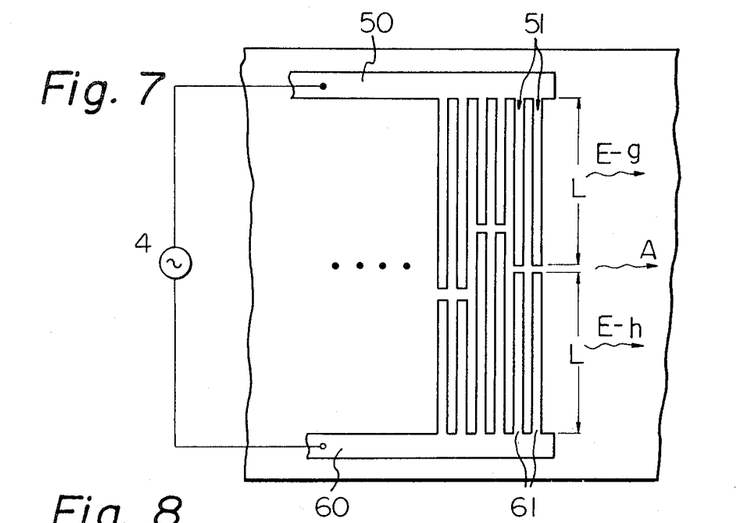
FIG. 7 shows still another structure of the interdigital electrode according to the present invention.

FIG. 7 shows another embodiment of the present transducer, in which a pair of interdigital electrodes 50 and 60 are excited by the balanced-type power source 4, and no electrode is grounded. In the embodiment of FIG. 7, the length L of the extreme end finger 51 of the first electrode 50 is the same as the length L of the extreme end finger 61 of the second electrode 60. Since two electrodes 50 and 60 are excited by the balanced type power source, the undesired surface wave E-g generated by the edge of the finger 51 is in opposite phase to that of the undesired surface wave E-h generated by the edge of the finger 61. Therefore, by designing the length of the fingers 51 and 61 equal to each other, those two undesired surface waves are cancelled by each other at the reception-facing side of the transducer.

Figure 8:
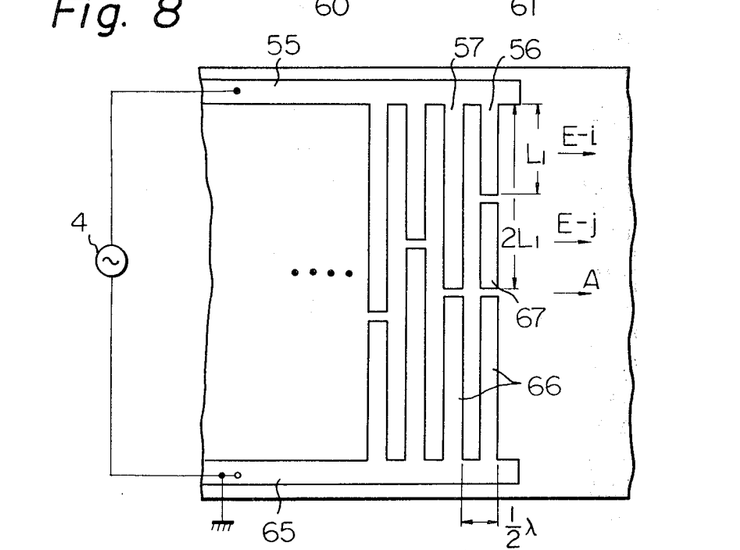
FIG. 8 shows still another structure of the interdigital electrode according to the present invention.

FIG. 8 shows the structure of another transducer according to the present invention, in which an electrode with fingers of ¼ wavelength of width is utilized, while the previous embodiments of FIGS. 5A, 5B, 6 and 7 use a split electrode with fingers having a width of ⅛ wavelength. FIG. 8 shows the embodiment when the electrodes are excited by the unbalanced power source 4, since one electrode 65 is grounded. In FIG. 8, the length $L_1$ of the finger 56 at the extreme end of the electrode 55 which is not grounded, is half of the length $2L_1$ of the finger 57 at the second extreme end of the electrode 55, and the spacing between the fingers 56 and 57 is ½ wavelength. Therefore, the undesired surface wave E-i generated by the edge of the finger 56 is cancelled by the undesired wave E-j generated by the finger 57. The reference numeral 66 in FIG. 8 shows a dummy finger, and 67 shows a floating finger.

It should be appreciated that modification of a ¼ wavelength finger electrode to a balanced type power source is obvious to those skilled in the art. Thus, an electrode of ¼ wavelength finger with two undesired-wave cancelers as shown in FIG. 6 is possible, and an electrode having ¼ wavelength fingers with a pair of extreme end fingers of equal length as shown in FIG. 7 is possible.

Figure 9A:
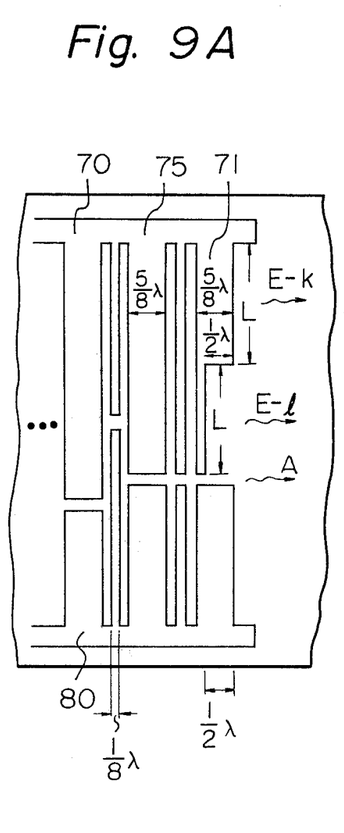
FIG. 9A and FIG. 9B show still more structures of the interdigital electrodes according to the present invention.

FIG. 9A shows another structure of the present transducer, in which an interdigital half electrode has a finger of ⅛ wavelength thickness and a finger of ⅜ wavelength thickness. And it is supposed that the electrodes 70 and 80 are excited by an unbalanced power source, and the electrode 80 is grounded. Therefore, the electrode 70 has the present undesired wave canceler, and the electrode 80 has no undesired wave canceler. In FIG. 9A, the extreme end finger 71 of the electrode 70 has the width ⅜ wavelength at the bottom top portion which is coupled with the common arm 75 of the electrode 70, and has a width of ⅛ wavelength at the bottom of the finger 71. The length L of the portion with the ⅛ wavelength width is the same as the length L of the portion with the ⅜ wavelength width, and the spacing between the right edge of the ⅜ wavelength width portion and right edge of the ⅛ wavelength width portion is ½ wavelength (=⅜−⅛=½). Accordingly, the undesired surface wave E-k generated at the edge of the ⅜ wavelength width portion of the finger 71 has the phase difference of ½ wavelength with respect to the undesired surface wave E-l generated at the edge of the ⅛ wavelength width portion of the finger 71. Thus, those undesired surface waves are cancelled by each other.

Figure 9B:
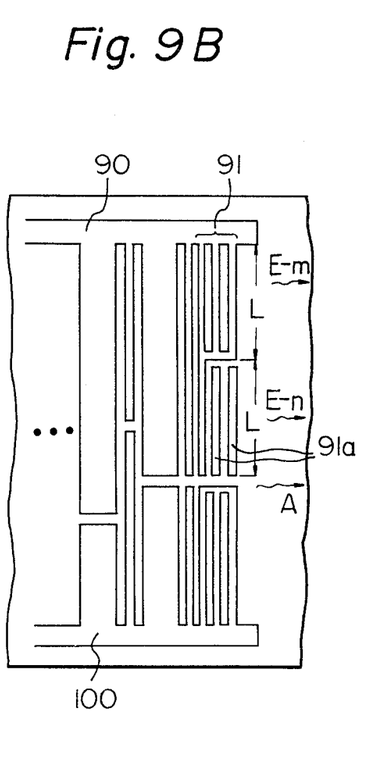

FIG. 9B is a modification of the embodiment of FIG. 9A, and the feature of the embodiment of FIG. 9B is the presence of the floating electrode 91a. Also, the extreme end finger 91 of the electrode 90 is divided into two fingers as shown in the figure. Due to the presence of the floating electrode 91a, the ratio of the substrate covered with the electrode conductor to the total length of the substrate in the transmission direction of the wave becomes almost equal in all the paths, and thus, the sound velocity of the surface wave becomes equal in all the paths. Accordingly, the wave front of the acoustic surface wave generated by the interdigital electrode is not deteriorated, and an excellent transducer or a bandpass filter is obtained.

It is obvious to those skilled in the art how to connect the embodiment having the electrode with a ⅛-wavelength-width finger and a ⅜-wavelength-width finger to a balanced-type power source, as in FIG. 6 and FIG. 7.

FIGS. 10A through 10D show some applications of the present undesired surface wave canceler to a bandpass filter. In those figures, the reference numeral 1 is a piezoelectric substrate, 2A is a transmission interdigital electrode, 2B is a reception interdigital electrode, 4 is a power source, and 5a and 5b are output terminals.

Figure 10A:
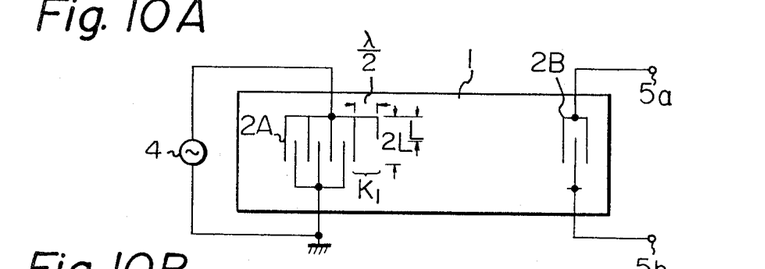
FIGS. 10A, 10B, 10C and 10D show some bandpass filters using the present acoustic surface wave transducer.

The embodiment of FIG. 10A has the undesired wave canceler $K_1$ on the transmission interdigital electrode at the side nearest the reception interdigital electrode. In FIG. 10A, the length of the extreme end finger is half of that of the second extreme end finger, and the spacing between those two fingers is ½ wavelength.

Figure 10B:
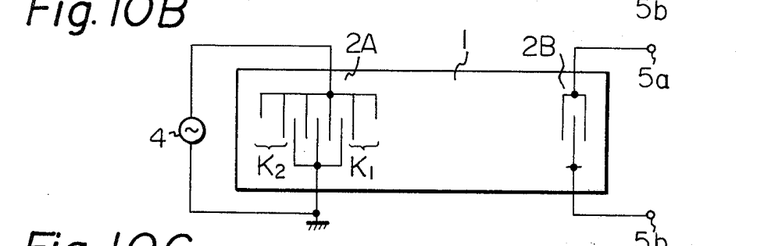

FIG. 10B is the an embodiment in which a pair of undesired-wave cancelers $K_1$ and $K_2$ are provided at both sides of the transmission-side interdigital electrode. In this configuration, the characteristics of the transducer are further improved.

Figure 10C:
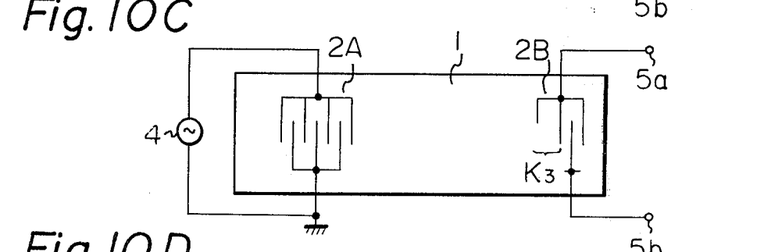

FIG. 10C is an embodiment in which the undesired-wave canceler $K_3$ is provided on the reception interdigital electrode at the side nearest the transmission interdigital electrode. The effect of the embodiment of FIG. 10C is almost the same as that of FIG. 10A.

Figure 10D:
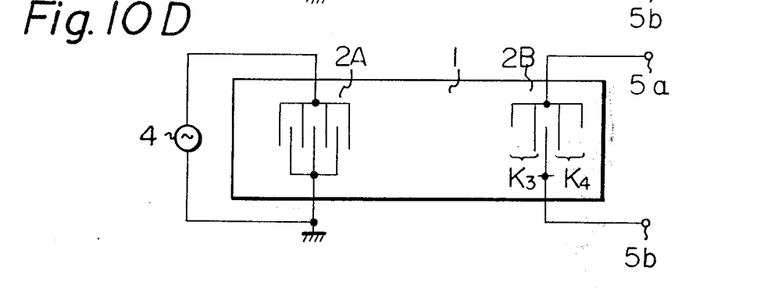

FIG. 10D is an embodiment in which a pair of undesired-wave cancelers $K_3$ and $K_4$ are provided at both sides of the reception interdigital electrode. The cancelling effect of FIG. 10D is almost the same as that of FIG. 10B.

Finally, a numerical embodiment of a bandpass filter utilizing the present undesired wave canceler is described. In the embodiment of a bandpass filter in 20 MHz band, the preferred substrate is Lithium-Niobate ($LiNbO_3$) with an area of 14 mm × 23 mm and thickness of 1 mm. The transmission interdigital electrode is an apodized electrode having 60 pairs of split fingers each having a ¼ wavelength width, and the reception interdigital electrode is a regular electrode having 5 pairs of split fingers each having a ¼ wavelength width. Those electrodes are made of gold (Au) plated on the nichrome substrate, and are deposited on the piezoelectric substrate through the conventional photolithograph process. The inband deviation of the above bandpass filter is less than 0.2 dB for the amplitude characteristics, and less than 20 nano-second for the group delay characteristics. The best characteristics of a conventional bandpass filter are 0.6 dB, and 60 nano-second. Therefore, the deviation of the present filter is improved by three times relative to that of a conventional filter.

As described above in detail, the present invention cancels the edge effect of an interdigital electrode in an acoustic surface wave transducer device by utilizing a pair of end fingers having the same non-overlapped, radiating length and spaced by ½ wavelength. Thus, the undesired surface wave generated at the edge of the extreme end finger is cancelled, and then, the characteristics of an acoustic surface wave device is improved. The present invention is applicable to all the acoustic surface wave devices, and in particular, the inband deviation of a bandpass filter is improved.

From the foregoing, it will now be apparent that a new and improved acoustic surface wave transducer has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An acoustic surface wave transducer configuration comprising:
   substrate means having at least a piezoelectric surface,
   a first interdigital electrode having a pair of comb-line type half electrodes engaged interdigitally with each other, disposed on said piezoelectric surface, and being operable to convert an input electrical signal from a power source to acoustic surface waves which propagate on said piezoelectric surface,
   a second interdigital electrode having a pair of comb-line type half electrodes engaged interdigitally with each other, disposed on said piezoelectric surface spaced from said first interdigital electrode by a predetermined distance, to convert said acoustic surface waves in said piezoelectric surface to an output electrical signal, and an edge effect canceller located at least at one of the extreme radiating edges of at least one of said interdigital electrodes, said edge effect canceller being constructed so that the length of the extreme end finger of said half electrode is approximately half of the electrode of the second extreme end finger of said half electrode so that the unobstructed edge lengths are equal, and the spacing between said extreme end finger and the second extreme end finger is $\frac{1}{2}$ of the wavelength of the acoustic surface wave.

2. An acoustic surface wave transducer configuration according to claim 1, wherein said interdigital electrode is a split interdigital electrode, and the width of a finger and spacing between each finger is $\frac{1}{8}$ wavelength.

3. An acoustic surface wave transducer configuration according to claim 1, wherein the width of a finger and the spacing between each finger is $\frac{1}{4}$ wavelength.

4. An acoustic surface wave transducer configuration according to claim 1, wherein said half electrodes have the alternate arrangement of a finger of $\frac{1}{8}$ wavelength width and a finger of $\frac{3}{8}$ wavelength width, and the spacing between each finger is $\frac{1}{8}$ wavelength.

5. An acoustic surface wave transducer configuration according to claim 1, wherein a floating finger is provided where no finger of an interdigital electrode is provided.

6. An acoustic surface wave transducer configuration according to claim 1, wherein said edge effect canceller is provided at the end of the first interdigital electrode facing the second interdigital electrode.

7. An acoustic surface wave transducer configuration according to claim 1, wherein said edge effect canceler is provided at both the extreme ends of the first interdigital electrode.

8. An acoustic surface wave transducer configuration according to claim 1, wherein said edge effect canceller is provided at the end of the second interdigital electrode facing the first interdigital electrode.

9. An acoustic surface wave transducer configuration according to claim 1, wherein said edge effect canceler is provided at both the extreme ends of the second interdigital electrode.

10. An acoustic surface wave transducer configuration comprising:

substrate means having at least a piezoelectric surface, a first acoustically radiative interdigital electrode having a pair of comb-line type half electrodes engaged interdigitally with each other, disposed on said piezoelectric surface, and being operable to convert an input electrical signal from a balanced power source to acoustic surface waves which propagate on said piezoelectric surface, a second acoustically radiative interdigital electrode having a pair of comb-line type half electrodes engaged interdigitally with each other, disposed on said piezoelectric surface spaced from said interdigital electrode by a predetermined distance, to convert said acoustic surface waves in said piezoelectric surface to an output electrical signal, the length of an end finger of at least one of the extreme ends of the first half electrode being the same as the length of an end finger of the second half electrode, and those two end fingers located at the same level along the transmission path of the acoustic surface wave in the substrate.

* * * * *